(12) United States Patent
Tsai et al.

(10) Patent No.: US 7,386,823 B2
(45) Date of Patent: Jun. 10, 2008

(54) RULE-BASED SCHEMATIC DIAGRAM GENERATOR

(75) Inventors: Tian-Hau Tsai, Shulin (TW); Po-Hung Lin, Zhubei (TW); Shyh-Chang Lin, Hsinchu (TW); Ho-Che Yu, Kaohsiung (TW)

(73) Assignee: Springsoft, Inc., Hsinchu (TW)

( * ) Notice: Subject to any disclaimer, the term of this patent is extended or adjusted under 35 U.S.C. 154(b) by 429 days.

(21) Appl. No.: 11/186,165

(22) Filed: Jul. 20, 2005

(65) Prior Publication Data

US 2007/0022399 A1 Jan. 25, 2007

(51) Int. Cl.
*G06F 17/50* (2006.01)

(52) U.S. Cl. .................. 716/10; 716/1; 716/7

(58) Field of Classification Search .............. 716/1, 716/4, 7, 10, 18
See application file for complete search history.

(56) References Cited

U.S. PATENT DOCUMENTS 5,696,943 A * 12/1997 Lee ................. 716/4
6,243,423 B1 * 6/2001 Sakoda et al. ............. 375/262
6,757,878 B2 * 6/2004 Srinivasan et al. ........... 716/10
7,020,854 B2 * 3/2006 Killian et al. ................. 716/1
7,180,968 B2 * 2/2007 Miyauchi et al. ........... 375/341
2006/0294483 A1 * 12/2006 Mukund et al. ............... 716/7

* cited by examiner

*Primary Examiner*—Stacy Whitmore
*Assistant Examiner*—Helen Rossoshek
(74) *Attorney, Agent, or Firm*—Daniel J. Bedell; Smith-Hill and Bedell

(57) ABSTRACT

A schematic diagram generator processes a netlist to generate a schematic diagram based on a set of placement rules, corresponding to a separate characteristic pattern of interconnected devices and specifying a constraint on relative placement within the schematic diagram of symbols representing devices forming the pattern. The generator identifies each set of devices in the netlist that exhibits any rule's interconnection pattern as a separate "soft group", places a constraint consistent with the rule on relative positioning within the schematic diagram of symbols representing the soft group, resolves any constraint conflicts in accordance with a constraint resolution scheme, and then places all device symbols in the schematic diagram in a manner consistent accordance with the constraints.

30 Claims, 7 Drawing Sheets

RULE-BASED SCHEMATIC DIAGRAM GENERATOR

BACKGROUND OF THE INVENTION

1. Field of the Invention

The invention relates in general to a system for processing a description of a circuit to produce a schematic diagram of the circuit wherein symbols are positioned to satisfy a set of rules specifying constraints on symbol placement.

2. Description of Related Art

A circuit designer typically generates a circuit design in the form of a netlist, a text file listing the circuit's input, output and internal signals (nets) and indicating how the nets are interrelated. The designer may initially generate a high-level netlist employing mathematical expressions to describe the relationships between signals carried on the nets, but as the circuit design progresses, the designer will produce a lower level netlist describing those relationships by describing various electronic circuit components to be included in the circuit and indicating which component terminals are connected to each net. For example, a netlist may reference a transistor or a resistor using a line of code indicating that it is an instance of a particular type of transistor and referencing the nets connected to each terminal.

A netlist is suitable for input to computer-aided design tools such as simulators, emulators and placement and routing tools, but designers often find schematic diagrams more helpful when trying to comprehend circuit designs. A schematic diagram is a graphical representation of a circuit using symbols and lines to represent circuit components and the nets that interconnect them. A designer can manually draw a schematic diagram based on a netlist, but would normally prefer to use a computer-aided schematic diagram generator that can automatically convert a netlist into a schematic diagram.

While an electronic circuit is an arrangement of low level devices such as transistors, resistors, capacitors and inductors interconnected by conductors, a circuit designer tends to view a circuit design as a set of subdesigns, wherein low level devices combine to form circuit modules having various higher level functions. For example in a digital circuit, transistors and other low level devices combine to form various logic gates and other digital devices. In an analog circuit, transistors and other devices combine to form various identifiable modules such a current mirrors, differential pairs and the like. A circuit designer will often organize a netlist description of a circuit to reflect the modularity of the design because by grouping the lines of code within the netlist describing the transistors or other device forming a particular module under a common heading, the designer can easily perceive that section of the netlist and forming a "subdesign" of the circuit design. Similarly, the circuit designer finds a transistor-level schematic diagram easiest to comprehend when it employs symbols arranged in well-known patterns to represent transistors and other devices such as capacitors and resistors forming known modules.

FIG. 1 depicts an example circuit diagram for a digital circuit 10 including a pair of inverter modules 11 and 12 and a set of NAND gate modules 13-16. When a schematic diagram generator processes a netlist to generate a schematic diagram, it could randomly place each transistor anywhere in the diagram, but that would make it very difficult for a designer to comprehend the diagram. The schematic diagram is more useful when the generator groups and orients the transistors in a way that the designer will be able to recognize them as forming particular kinds of circuit modules. For example, the arrangement of the two transistor symbols forming inverter gate 11 is well known, and an experienced designer would immediately recognize those two transistors as forming an inverter. However, if the transistor symbols were remote from one another in the schematic diagram, the designer would find it more difficult to identify them as an inverter. In addition to placing the two transistors forming inverter 11 near one another within the schematic diagram, the schematic diagram generator should also orient them in a way that the designer expects to see them. The orientation shown in FIG. 1 is the most common way to represent an inverter. FIG. 2 is another way to represent an inverter in a schematic diagram, but while a designer could deduce that FIG. 2 represents an inverter, he or she probably would not immediately recognize it as an inverter because the transistor symbols do not exhibit an expect arrangement pattern for an inverter. Thus, a typical schematic diagram generator will study a netlist to identify all recognizable module subdesigns and then generate a schematic diagram representing those subdesigns in some standard manner.

FIG. 3 is a flow chart depicting the major processing steps carried out by a typical prior art schematic diagram generator when converting a transistor-level netlist into a schematic diagram. The generator first studies the netlist to identify each recognizable subdesign (step 17) using a database of standard subdesign patterns to help it identify subdesign patterns. It then generates a schematic diagram for each subdesign (step 18) using information from the pattern database to tell it how to arrange the schematic layout for each subdesign. It then generates the top-level schematic by establishing a position and orientation within the schematic for each subdesign layout and for each transistor or other device symbol not included in one of the subdesigns.

This approach can work well for generating schematic diagrams for digital circuits because a designer tends to think of a digital circuit as a network of interacting circuit modules such as logic gates and other devices, and best understands a schematic diagram organized along these lines. On the other hand, even though an analog circuit will include identifiable modules such as differential pairs, current mirrors, and the like, an analog circuit designer also tends to view an analog circuit in ways other than on a module-by-module basis. For example, an analog circuit designer is interested in determining how current flows though transistors and other devices connected in series between power and ground, and how data signals flow from transistor-to-transistor. Thus while organizing a schematic diagram for an analog circuit along modular lines, as an arrangement of subdesigns, can help a designer understand an analog circuit schematic diagram, a computer-aided schematic diagram generator should also take other considerations into account when generating a schematic diagram for an analog circuit.

BRIEF SUMMARY OF THE INVENTION

A schematic diagram generator implements a method in accordance with the invention for processing a circuit description, such as for example a netlist, to automatically determine where to place and orient symbols representing low-level circuit devices such as transistors, resistors and the like, or higher level circuit' devices (modules) formed by interconnected sets of low-level devices.

The schematic diagram generator establishes one or more placement rules, wherein each rule corresponds to a separate characteristic pattern of interconnected devices. Each rule specifies one or more constraints on relative ordering, positions and/or orientation within the schematic diagram of a set of symbols representing a group of the devices interconnected to form the characteristic pattern corresponding to that rule. Some or all of the rules may be user-supplied. Each placement rule can affect the layout of a schematic diagram by indicating a particular manner of arranging devices relative to one another based on relationships between the devices. For example, one rule might specify that devices connected in series between power and ground should be vertically ordered in a particular way within the schematic diagram. Another rule might specify that devices that communicate with one another should be horizontally ordered in a particular way.

For each rule, the schematic diagram generator processes the circuit description to generate placement control data defining a set of "soft groups", wherein each soft group includes as members a set of devices of the electronic circuit exhibiting the rule's corresponding characteristic pattern. Consistent with the constraints specified by the rule, the placement control data also defines one or more constraints on placement within the schematic diagram of a set of symbols representing the devices of each soft group.

Since each device may be related in various ways to many other devices, each device may be a member of more than one soft group. Thus, the placement of any particular device within the schematic diagram may be subject to constraints based on more than one placement rule. Since some of the placement constraints on a device may conflict, the schematic diagram generator must resolve constraint conflicts before attempting to place device symbols within the schematic diagram. Therefore, after generating the placement control data establishing all soft groups consistent with the placement rules, the schematic diagram generator processes the data to identify any conflicts among the specified placement constraints associated with the soft groups, and then resolves the conflicts by eliminating some of the soft groups and retaining others in accordance with a constraint resolution scheme, which may be user-defined.

Thereafter, the schematic diagram generator carries out a placement process wherein it selects positions within the schematic diagram for symbols representing all devices forming the circuit in a manner consistent with the constraints placed on the retained soft groups. The schematic diagram generator then carries out a routing process wherein it determines how to represent conductors interconnecting the devices. The schematic diagram generator then generates the schematic diagram including symbols representing electronic devices residing at the selected positions and representations of the conductors interconnecting the electronic devices.

The claims appended to this specification particularly point out and distinctly claim the subject matter of the invention. However those skilled in the art will best understand both the organization and method of operation of what the applicant(s) consider to be the best mode(s) of practicing the invention, together with further advantages and objects of the invention, by reading the remaining portions of the specification in view of the accompanying drawing(s) wherein like reference characters refer to like elements.

DETAILED DESCRIPTION OF THE INVENTION

The present invention relates to a computer-aided schematic diagram generator that may be implemented in the form of software stored on computer-readable media such as, but not limited to, compact disks, hard disks, floppy disks, and computer memory. When read and executed by a conventional computer, the software causes the computer to convert a description of an electronic circuit, such as for example a netlist, into a schematic diagram graphically depicting the circuit. While the specification below describes an exemplary embodiment of the invention considered a best mode of practicing the invention, the claims appended to this specification define the invention. Those of skill in the art will appreciate that the preferred embodiment of the invention described below is one of many possible ways to implement the invention defined by the claims.

The schematic diagram generator generates a schematic diagram employing symbols to represent low-level devices such as transistors, resistors, capacitors and the like forming the circuit and/or to represent high-level devices (modules) formed by lower level devices. The symbols include representations of device terminals, and the schematic diagram provides an indication as to how conductors interconnect the devices, for example by providing lines interconnecting the symbol terminals or by labeling symbol terminals with characters referencing conductors. While the example embodiment of the invention described below generates a schematic diagram based on a netlist description of a circuit, it can generate a schematic diagram based on any other kind of circuit description describing the devices forming the circuit and indicating how their terminals are connected to one another and to the circuit's input/output (IO), power and ground terminals. The specification below provides an example showing how the method generates a schematic diagram for an analog circuit, but the method can also generate schematic diagrams for digital circuits and mixed digital/analog circuits.

Example Process Overview

Figure 4:
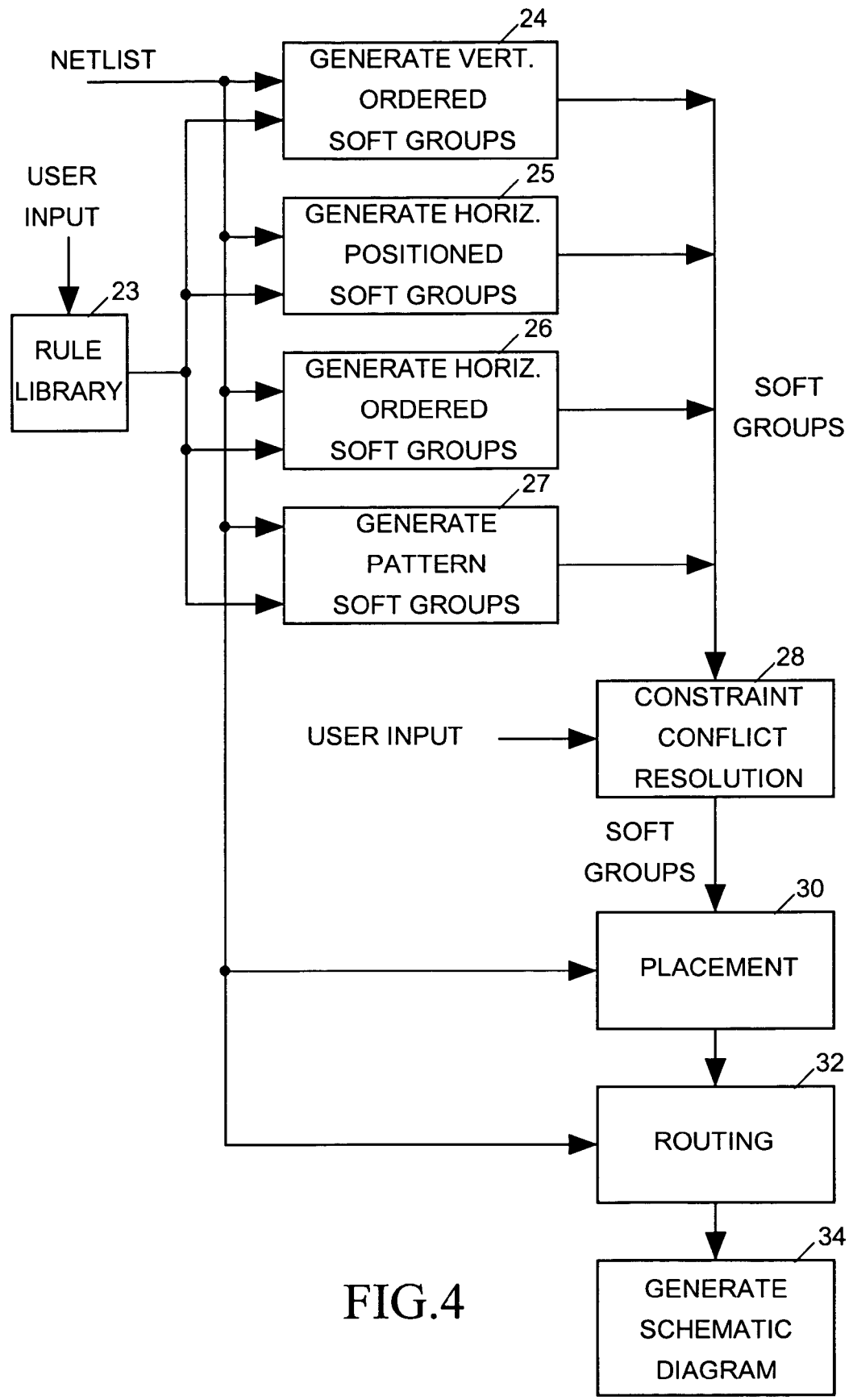
FIG. 4 is a data flow diagram illustrating a schematic diagram method in accordance with an example embodiment of the invention.

FIG. 4 is a data flow diagram illustrating the steps of an example implementation of a method carried out by a computer-aided schematic diagram generator in accordance with the invention for converting a netlist description of a circuit into a schematic diagram of the circuit. The following is an example netlist description of an operational amplifier the method of FIG. 4 could process to produce a schematic diagram.

```
       *.EQUATION
       *.SCALE METER
       *.MEGA
       .PARAM
       *GLOBAL gnd!
       *.PIN gnd!
       .SUBCKT opamp Vdd Vout vin_n vin_p
       *.PININFO Vdd:I vin-n:I vin_p:I Vout:O
    cDeviceJ Vout net12 500.0f $[CP]
    mDeviceE net13 net13 gnd! gnd! NM W=10u L=5u
    mDeviceG net12 net13 gnd! gnd! NM W=10u L=5u
    mDeviceH Vout net12 gnd! gnd! NM W=40u L=5u
    mDeviceF net12 vin_p net32 net32 PM W=75u L=5u
    mDeviceB Vout net20 Vdd Vdd PM W=50u L=5u
    mDeviceD net13 vin_n net32 net32 PM W=75u L=5u
    mDeviceC net32 net20 Vdd Vdd PM W=25u L=5u
    mDeviceA gnd! gnd! net20 net20 PM W=5u L=59u
    mDeviceI net20 net20 Vdd Vdd PM W=25u L=25u
       .ENDS
```

The "PININFO" line of code lists the circuit's input and output pins, and each "DEVICE" line describes a separate device to be included in the circuit, indicating its name, device type, and indicates the pin or net connected to each of its terminals.

Figure 5:
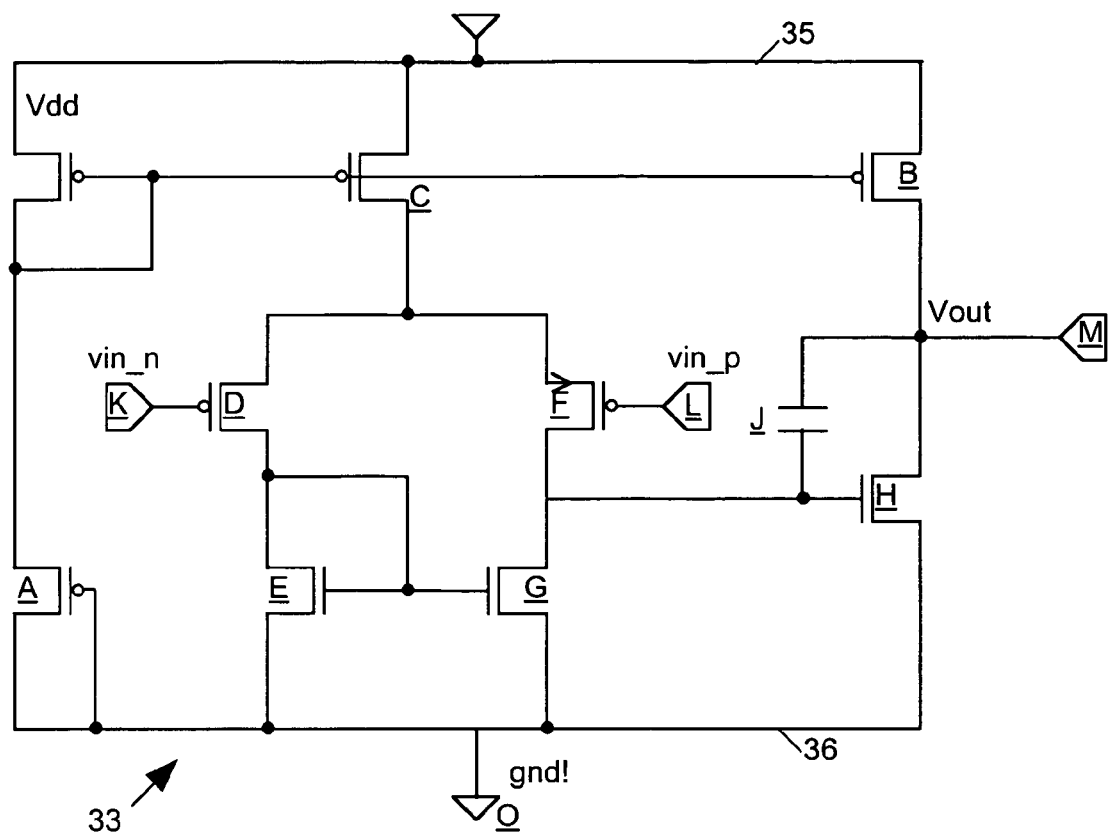
FIG. 5 is a schematic diagram as that could be generated by the method of FIG. 4.

FIG. 5 depicts an example schematic diagram 33 the method of FIG. 4 could generate in response to the netlist to graphically depict the operational amplifier circuit. The amplifier circuit includes six pmos transistors (A, B, C, D, F, I), three nmos transistors (E, G, H) and a capacitor (J), an input terminal N for receiving a power supply voltage (Vdd), a ground terminal (O), input terminals (K, L), and an output terminal (M).

The following discussion assumes a schematic diagram has a vertical Y-axis extending in a positive vertical direction from its bottom edge to its top edge and a horizontal X-axis extending in a positive horizontal direction from its left edge to its right edge. A symbol for some device A is considered to reside "higher" than a symbol for a device B when it is closer to the top edge of the schematic diagram than device B, and is considered to reside "to the left" of device B when it is closer to the left edge of the schematic diagram than device B.

As described in more detail below, the schematic diagram generator maintains a rule library 23 defining one or more placement rules, wherein each rule corresponds to a separate characteristic pattern of interconnected devices. Each rule specifies a constraint on the relative positioning and/or orientation within the schematic diagram of symbols representing a group of the devices interconnected to form the characteristic pattern corresponding to that rule. Some or all of the rules may be user-supplied.

For each rule, the schematic diagram generator processes the circuit description at one of steps 24-27 to determine each set of devices of the electronic circuit exhibiting the rule's corresponding characteristic pattern. The schematic diagram generator produces placement control data defining each identified set of devices as a "soft group" for which symbol placement it to be governed by the rule. Based on the placement constraints specified by the rule associated with each soft group, the placement control data also defines one or more constraints on relative positioning and/or orientation within the schematic diagram of a set of symbols representing the members of the soft group.

After generating the placement control data defining the soft groups at steps 24-27, the schematic diagram generator processes the placement control data at step 28 to identify any conflicts in the constraints placed on the positioning of any device symbol within the schematic diagram. The schematic diagram generator resolves the conflicts by eliminating some of the soft groups, and their associated placement constraints, and retaining others as necessary to provide a consistent set of constraints on symbol placement. The constraint resolution scheme used at step 28 may be user-defined. Thereafter, the schematic diagram generator carries out a placement process (step 30) wherein it selects positions within the schematic diagram for symbols representing all devices forming the circuit in a manner consistent with the retained soft group constraints. The schematic diagram generator then carries out a routing process (step 32) wherein it determines how to represent conductors interconnecting the devices, The schematic diagram generator then (step 34) generates the schematic diagram including symbols representing electronic devices residing at the selected positions and representations of the conductors interconnecting the electronic devices.

A placement rule may specify, for example, that the schematic diagram generator should place the symbols for devices exhibiting a particular interconnection pattern in some particular order in a specified direction of the schematic diagram, in some particular two-dimensional pattern, or with particular orientations. While FIG. 4 shows that the example schematic diagram generator generates soft groups at steps 24-27 in response to four different types of placement rules, a user may specify other types of placement rules placing other kinds of constraints on soft groups. Also, while the specification below details the four example types of placement rules, those of skill in the art will appreciate that a user can provide a schematic diagram generator in accordance with the invention with other types of placement rules in order to achieve other kinds of placement results.

Vertical Ordering Rules

Rule library 23 may include one or more "vertical ordering" rules. A vertical ordering rule specifies that symbols representing groups of devices exhibiting particular interconnection patterns should be ordered in some particular way in the vertical direction of the schematic diagram. At step 24, the schematic diagram generator processes the netlist to identify each group of devices exhibiting one of the interconnection patterns associated with any one of the vertical ordering rules. It generates placement control data defining a soft group for each identified device group, referencing the device members of the group and defining a constraint specifying a vertical order in which their symbols should appear in the schematic diagram. For example, a vertical ordering constraint may specify that a symbol for a device A should reside at a higher position in the schematic diagram than a symbol for a device B. A suitable representation for such a vertical ordering soft group is $$\{A, B\}, \{A_y > B_y\}$$

where $A_y$ and $B_y$ are the vertical positions of devices A and B with respect to the Y-axis, and the ">" symbol indicates the symbol for device A should reside at a higher position than the symbol for device B.

Figure 6:
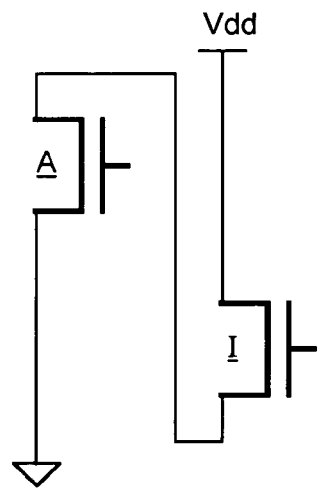
FIG. 6 is an example of a schematic diagram that the method of FIG. 4 would avoid generating.

For example, a vertical ordering rule can be used to help position device symbols within a schematic diagram to make it easer for an analog designer to trace current flows from power to ground through the devices forming a circuit. Schematic diagram 33 of FIG. 5 depicts power and ground as lines 35 and 36 extending horizontally along the top and bottom of the diagram. The vertical ordering rule can specify that when a set of devices are in series such that the devices would form a current path if they were each in a conductive state, symbols representing the devices should be ordered in the vertical direction of the schematic diagram in accordance with a series order in which the devices are interconnected. Soft groups based on that rule would establish constraints ordering the symbols representing each such device pair so that, in the schematic diagram, the designer will trace current downward from device-to-device, but not upward. For example, since current passes from power to ground first through transistor I and then transistor A of FIG. 5, the schematic diagram generator would establish a vertical positioning soft group identifying transistors I and A and indicating that transistor I should be placed above transistor A, closer to power line 35. Given such a constraint on placement, the schematic diagram generator would not position transistor A above transistor I, for example as shown in FIG. 6, making it harder for the designer to trace current flows through the transistors.

Figure 7:
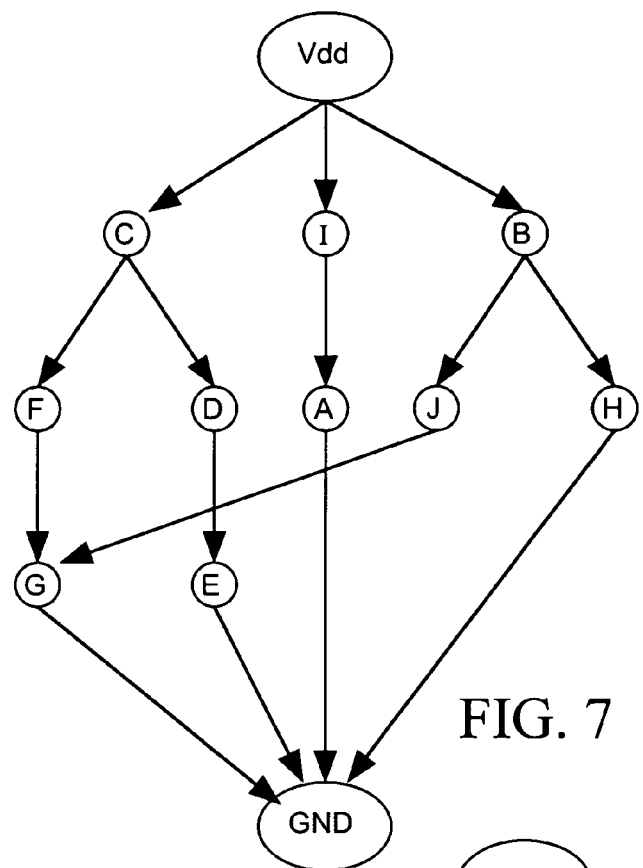
FIGS. 7-9 are graphs depicting a manner in which current flows in the circuit of FIG. 5.

To identify soft groups for devices subject to this type of vertical ordering rule, the schematic diagram generator processes the netlist at step 23 to generate a current flow graph, for example, as illustrated in FIG. 7. Each node of the graph represents a separate one of devices A-J of the circuit of FIG. 5, and each edge (arrow) of the graph indicates a current flow direction between the devices. Table I illustrates the current flow direction through various example types of transistors and for diodes.

TABLE 1

| Type | Current Direction |
| --- | --- |
| pmos | source-to-drain |
| nmos | drain-to-source |
| N-JFET | drain-to-source |
| P-bipolar | emitter-to-collector |
| diode | anode-to-cathode |

The schematic diagram generator ignores current flow through transistor bases and gates when establishing vertical ordering constraints. For resistors, capacitors, inductors, and other bi-directional, two-terminal devices, current flow direction between terminals is arbitrary.

FIG. 7 shows that current flows from Vdd through devices C, I and B, from device C to devices F and D, from device I to device A, and from device B to devices J and H. Currents flowing through devices F and J pass to ground through device G. Current flowing through device D passes to ground through device E, and currents flowing through devices A and H passes directly to ground. Having established the current flow graph of FIG. 7, the schematic diagram generator next identifies each pair of nodes interconnected by an edge of the graph.

Figure 8:
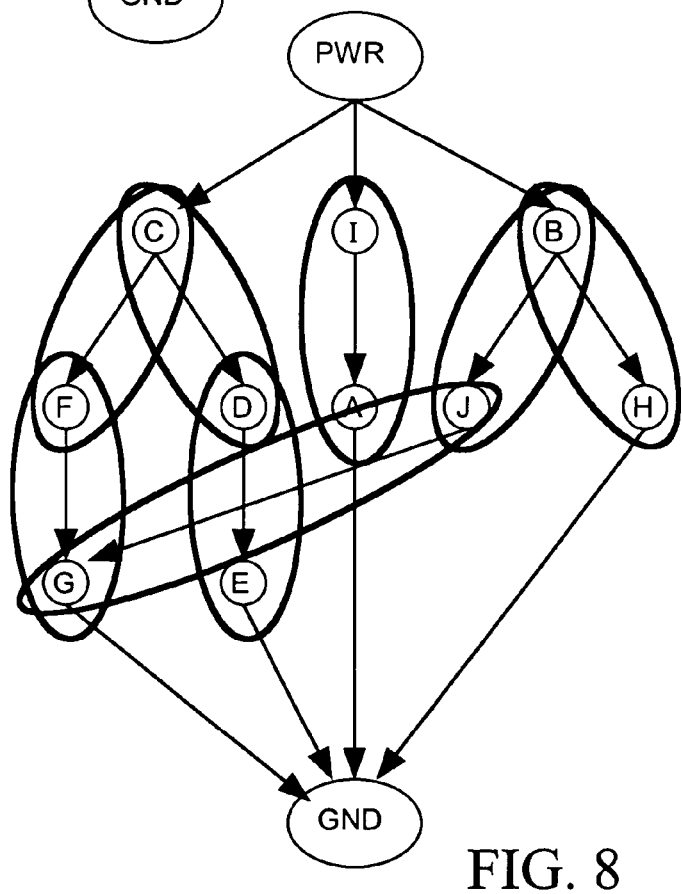

FIG. 8 shows how the schematic diagram generator groups the node pairs. Note each node may be included in more than one pair. For example, nodes C and F form one pair, while nodes, F and G form another. The schematic diagram generator creates a separate soft group for the devices corresponding to each node pair as illustrated in Table II.

TABLE II

| Group | Constraint |
| --- | --- |
| {C, D} | {$C_y > D_y$} |
| {C, F} | {$C_y > F_y$} |
| {F, G} | {$F_y > G_y$} |
| {D, E} | {$D_y > E_y$} |
| {I, A} | {$I_y > A_y$} |
| {B, J} | {$B_y > J_y$} |
| {B, H} | {$B_y > H_y$} |
| {J, G} | {$J_y > G_y$} |

Horizontal Positioning Rules

Rule library 23 may include one or more "horizontal positioning" rules specifying that symbols representing groups of devices exhibiting particular interconnection patterns should be positioned proximate to one another in some particular way relative to the horizontal direction of the schematic diagram. At step 25, the schematic diagram generator processes the netlist to identify each group of devices that are subject to a horizontal positioning rule and generates a soft group consistent with the rule.

For example, a horizontal positioning rule may specify that when there are two devices and the current flows from one to another, symbols representing those devices should be positioned near one another in the horizontal direction within the schematic diagram. The following code represents a soft group specifying that symbol for devices A and B should reside near one another:

{A,B}, {$A_x$ near $B_x$} where $A_x$ and $B_x$ are the horizontal positions of the two symbols within the schematic diagram and the "near" word indicates a preference for positioning the two symbols as close as possible to one another in the horizontal direction. For the circuit of FIG. 5, such a horizontal positioning rule would cause the schematic diagram generator to generate set of soft groups listed below in Table III.

TABLE III

| Group | Constraint |
| --- | --- |
| {C, D} | {$C_x$ near $D_x$} |
| {C, F} | {$C_x$ near $F_x$} |
| {F, G} | {$F_x$ near $G_x$} |
| {D, E} | {$D_x$ near $E_x$} |
| {I, A} | {$I_x$ near $A_x$} |
| {B, J} | {$B_x$ near $J_x$} |
| {B, H} | {$B_x$ near $H_x$} |
| {J, G} | {$J_x$ near $G_x$} |

Horizontal Ordering Rules

Rule library 23 may include one or more "horizontal ordering" rules specifying that symbols representing groups of devices exhibiting particular interconnection patterns should be ordered in some particular way in the horizontal direction of the schematic diagram. At step 26, the schematic diagram generator processes the netlist to identify each group of devices it determines should be represented in the schematic diagram by symbols positioned in some particular order in the horizontal direction and generates a soft group for each such group. The soft group references the group and indicates the preferred horizontal order in which their symbols should appear in the schematic diagram. For example, a horizontal ordering constraint may specify that symbol for a device A should be to the left of a device B. A suitable code for such a horizontal ordering constraint is:

$$\{A,B\}, \{A_x<B_x\}$$

In this context, the "<" symbol means "to the left of".

For example the schematic diagram generator can use horizontal ordering constraints to help order symbols horizontally to minimize the distance and complexity of lines representing signal paths between devices by giving preference to placing symbols for devices that are interconnected to one another next to one another in the schematic diagram. Since designers usually like to see signal flows traveling to the right in a schematic diagram, the schematic diagram generator can use horizontal ordering constraints to give preference to placing signal transmitting devices to the left of signal receiving devices.

Figure 9:
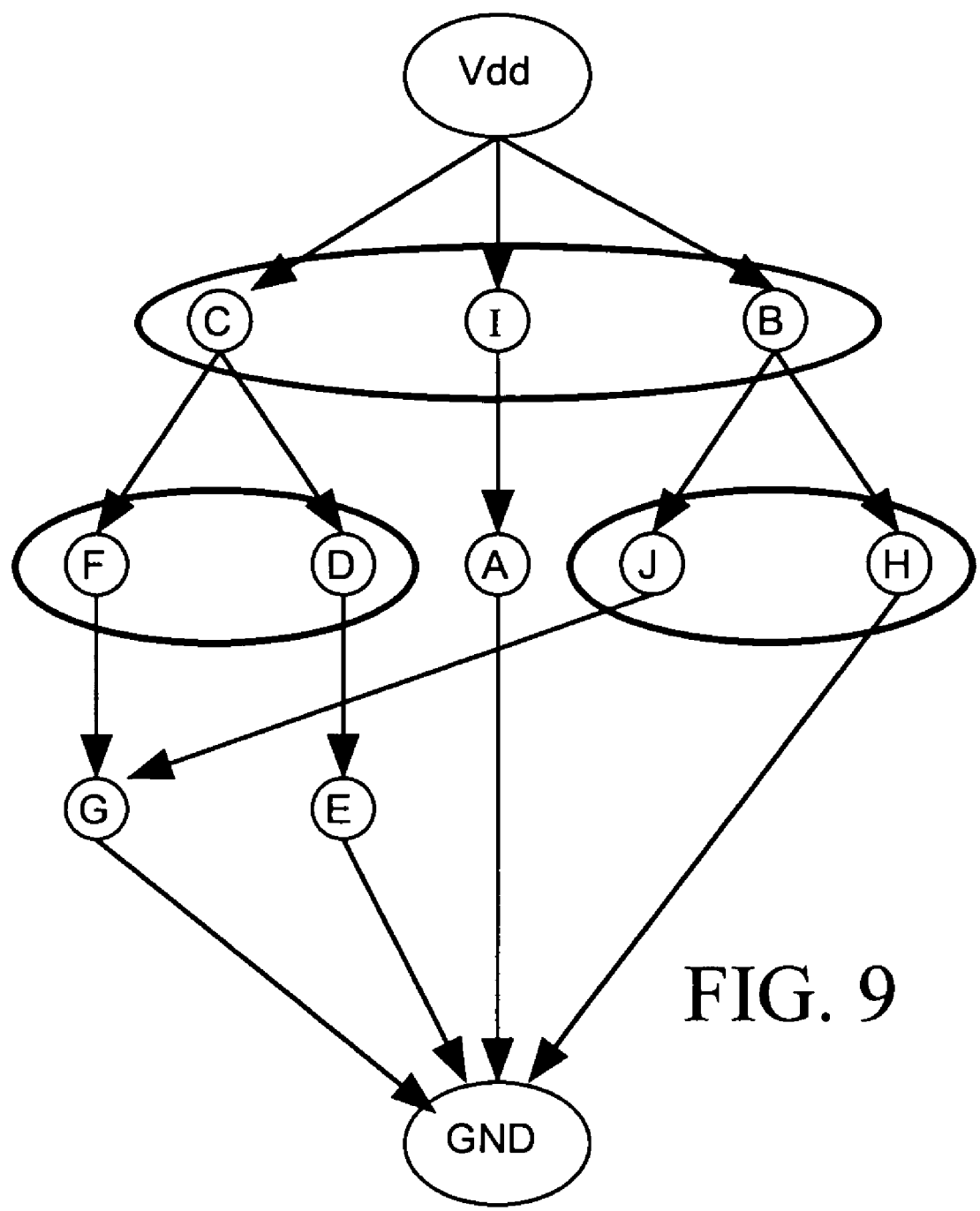

For example, the schematic diagram generator can apply horizontal ordering constraints at step 26 of FIG. 4 to each group of child device that receive current from the same parent device. The graph of FIG. 9 shows there are three such groups in the circuit of FIG. 5. The schematic diagram generator studies the connectivity between the devices of each group to determine a preferable horizontal ordering for the devices within the schematic diagram.

For example, in deciding how to horizontally order the child group including device symbols C, I, and B, the schematic diagram generator first decides it would be preferable to place symbols C and B next to one another. As seen in FIG. 5, a net interconnects the children F, J and H of symbols C and B, and by placing symbols C and B next to one another, the schematic diagram generator can minimize the length of that net. Since no nets interconnect the children of I and B or I and C, it is less help to place symbols I and B or I and C next to one another.

Since designers prefer to see signals traveling from left to right in a schematic diagram, the schematic diagram generator decides to place symbol C to the left of symbol B because the child symbol F of symbol C is the source of the signal conveyed by the net connected between symbol F and symbols J and H. Also, since designers prefer to place output signals nearer the right side of the diagram, it is preferable to place symbol B to the right since a net connects its children J and H to an output pad M.

Thus having selected a left-right horizontal order (C,B) for symbols C and B, the schematic diagram generator decides whether to place symbol I to the left or right of symbols C and B. The schematic diagram generator decides to place symbol I to the left of C and B because device I is the source of a signal input to device C. Placing symbol I to the left of symbol C helps minimize the length and complexity of the line representing the net conveying that signal and allows the signal to travel in the preferred left-to-right direction. Thus at step 26, the schematic diagram generator generates a horizontal ordering constraint for devices C, I and B as follows:

$$\{I,C,B\}, \{I_x<C_x<B_x\}$$

For the group of device symbols including F and D of FIG. 9, the schematic diagram generator decides it is preferable to place symbol D to the left of symbol F because as seen in FIG. 5, a net links symbol F to symbols J and H. The schematic diagram generator notes that symbol F is a child of symbol C and that J and H are children of symbol B. Since the schematic diagram generator has established that symbol C should reside to the left of symbol B, it determines that it can minimize the length of the net line between symbols J and G by placing symbol D to the left of symbol F. Thus at step 26, the schematic diagram generator generates a soft group for symbols D and F as follows:

$$\{D,F\}, \{D_x<F_x\}$$

For the group of device symbols including J and H of FIG. 9, the schematic diagram generator decides it is preferable to place symbol J to the left of symbol H. Although FIG. 5 shows a net links symbol F to both symbols J and H, a net also connects symbol J to the left side of symbol H. Thus, the schematic diagram generator places symbol J on the left side of symbol H because there is a control signal flow from J to H, and therefore it generates a soft group for symbols J and H as follows:

$$\{J,H\}, \{J_x<H_x\}$$

Pattern Rules

Designers are accustomed to seeing certain electronic structures, such as for example differential pairs and current mirrors, represented by particular ways in a schematic diagram with respect to the relative positions and orientations of the devices forming the structures. Rule library 23 may include one or more "pattern" rules specifying that symbols representing groups of devices exhibiting particular interconnection pattern should be oriented and/or positioned relative to one another in some particular way within the schematic diagram. At step 27, the schematic diagram generator processes the netlist to identify each group of devices subject to a pattern rule and then generates soft groups specified by the pattern rule for each identified group.

Figure 10:
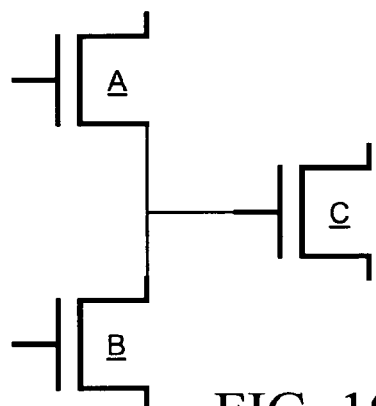
FIGS. 10-16 are schematic diagrams depicting example device interconnection patterns.

Pattern rules can help the schematic diagram generator to arrange symbols depicting various analog circuits such as, for example, current mirrors and differential pairs in well-known patterns in the schematic diagram so that circuit designers familiar with those patterns can easily recognize them. FIG. 10 depicts an example arrangement of three transistors A, B and C that a user might like to be subject to a pattern rule. In this example, the user wants the symbol for A to reside higher in the schematic diagram than B, and symbol C to reside below symbol B. Thus, the pattern rule will indicate the following soft groups should be applied to any set of symbols A, B and C representing devices in the netlist that exhibit the specified pattern:

$$\{A,C\}, \{A_y>C_y\}$$

$$\{B,C\}, \{B_y<C_y\}$$

Whenever the schematic diagram generator encounters this pattern at step 27, it will employ the above as a model for creating a soft group for the pattern. Since devices F, G and H of FIG. 5 exhibit the pattern of FIG. 10, the schematic diagram generator will generate the soft group $$\{F,H\}, \{F_y>H_y\}$$

$$\{G,H\}, \{G_y<H_y\}$$

when it encounters the pattern at step 27.

Figure 11:
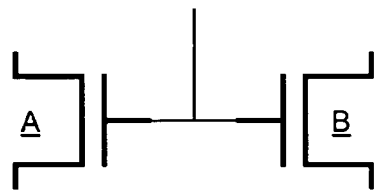

FIG. 11 depicts another pattern a user might subject to a pattern rule. When two transistor gates are interconnected, a user preferring the symbols for those transistors A and B to reside at the same position vertically, could provide a pattern rule specifying the following soft group:

$$\{A,B\}, \{A_y=B_y\}.$$

For example, when processing a netlist for the circuit of FIG. 5, the schematic diagram generator would note that device pairs E and G exhibit this pattern and would therefore generate the soft group {E,G}, {$E_y=G_y$} for that pair. For the group of gate-connected devices I, C and B of FIG. 5, the schematic diagram generator would generate the soft group {I,C}, {$I_y=C_y$}

{I,B}, {$I_y=B_y$}

{C,B}, {$C_y=B_y$} which the schematic diagram generator can combine to form a single soft group

{I,C,B}, {$I_y=C_y=B_y$}.

Figure 12:
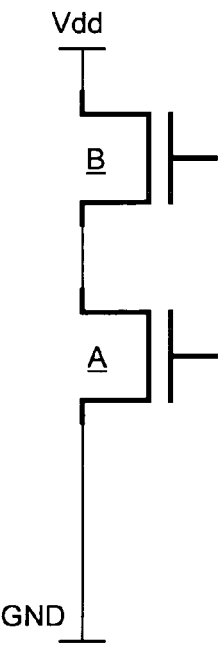
Figure 13:
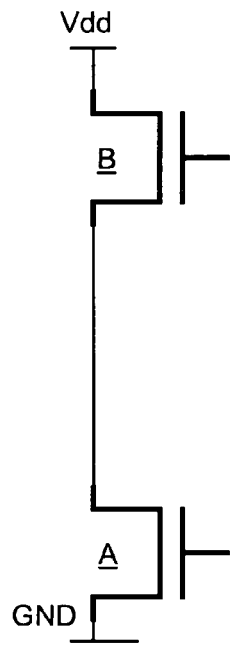
Figure 14:
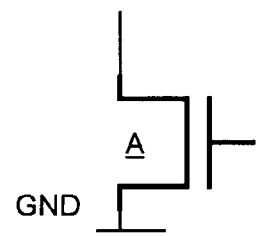

FIG. 12 shows a pair of transistors {A, B} connected in series to provide a signal path between Vdd and ground. The traditional practice is to position the symbol for any transistor that is directly connected to ground at the bottom of the schematic diagram near the ground line as illustrated in FIG. 13. Thus consistent with that practice, the schematic diagram generator should place the symbol for transistor A closer ground as illustrated. To ensure this, the designer can provide a pattern rule for the pattern shown in FIG. 14 specifying the following soft group:

{A}, {lowest position}

For example, when processing a netlist for the circuit of FIG. 5, the schematic diagram generator would note that devices A, E, G and H all exhibit this pattern and would therefore generate the following soft group:

{A, E, G, H}, {lowest position}

Figure 15:
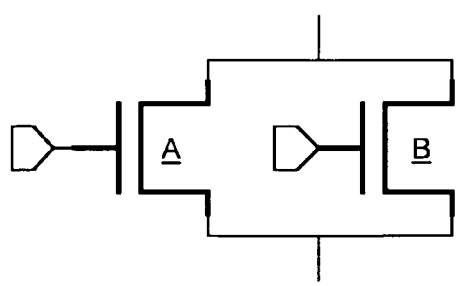
Figure 16:
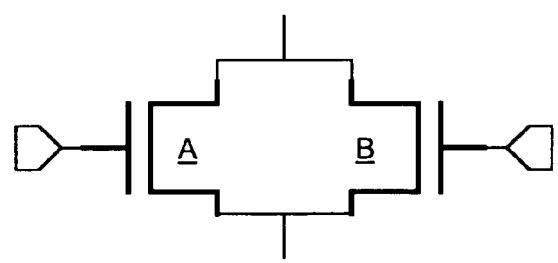

FIG. 15 shows a pair of transistors A and B connected source-to-source and/or drain-to-drain with gates connected to different input ports. Schematic diagrams traditionally this transistor pattern as depicted in FIG. 16 with the transistors aligned vertically and their gates facing in opposite directions. The pattern rule could specify the following soft group template for this pattern:

{A,B}, {left transistor face left, right transistor face right} where "face left" or "face right" indicates that the gate of the device A symbol is to face to the left or right. Thus, which ever of transistors A and B is placed to the left, its gate should face left, and the rightmost transistor's gate should face right. For example, when processing a netlist for the circuit of FIG. 5, the schematic diagram generator would note that devices D and F exhibit this pattern and would therefore generate the following soft group:

{D,F}, left transistor face left, right transistor face right}

Constraint Conflict Resolution

During steps 24-27, the schematic diagram generator could generate the following soft groups for the circuit of FIG. 5:

{C, D}, {$C_y>D_y$, $D_x$ near $C_x$}

{C, F}, {$C_y>F_y$, $F_x$ near $C_x$}

{F, G}, {$F_y>G_y$, $G_x$ near $F_x$}

{D, E}, {$E_y>D_y$, $E_x$ near $D_x$}

{I, A}, {$I_y>A_y$, $A_x$ near $I_x$}

{B, J}, {$B_y>J_y$, $J_x$ near $B_x$}

{B, H}, {$B_y>H_y$, $H_x$ near $B_x$. $B_x=H_x$}

{J, G}, {$J_y>G_y$, $J_x$ near $G_x$}

{I,C,B}, {$I_x<C_x<B_x$, $I_y=C_y=B_y$}

{D,F}, {$D_x<F_x$, left transistor face left, right transistor face right}

{J,H}, {$J_x<H_x$}

{F,G,H}, {$F_y>H_y$, $G_y<H_y$}

{E,G}, {$E_y=G_Y$}

{A,E,G,H}, {lowest position}

Figure 1:
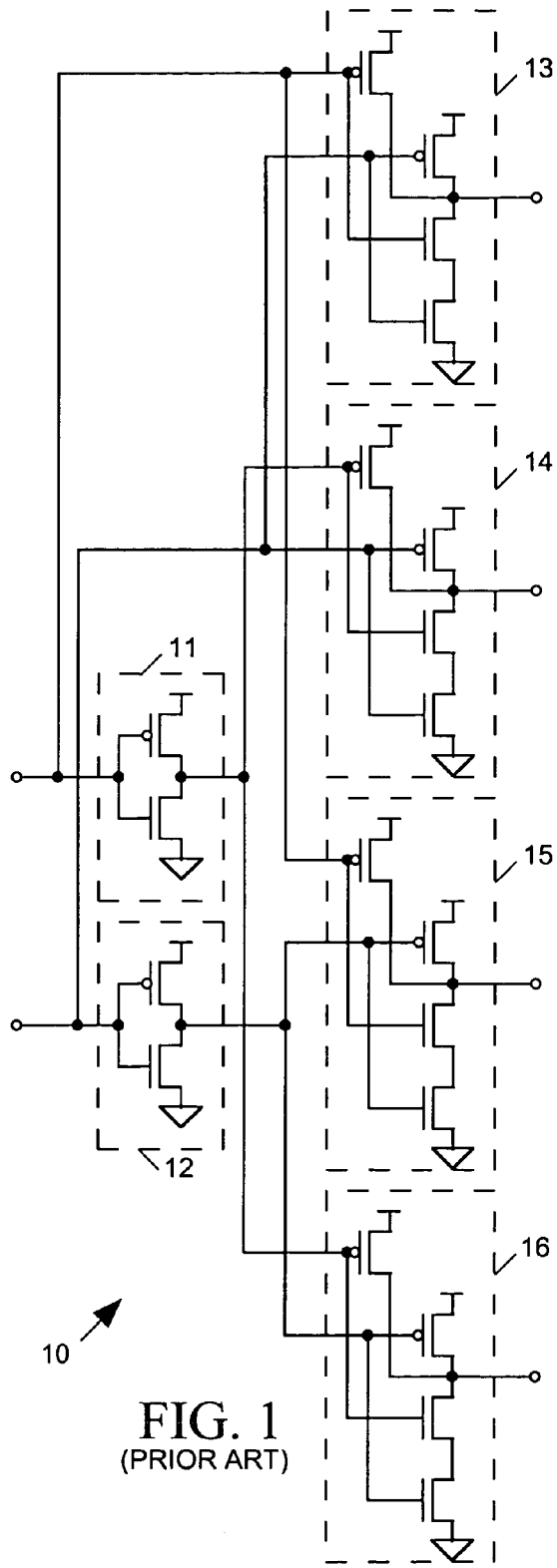
FIGS. 1 and 2 are schematic diagrams depicting circuits.
Figure 2:
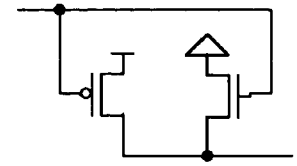
Figure 3:
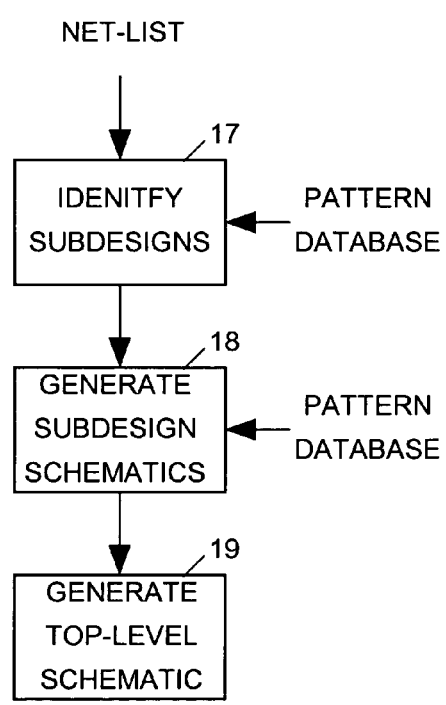
FIG. 3 is a data flow diagram illustrating a prior art method for generating a schematic diagram.

A typical prior art schematic diagram generator as illustrated in FIG. 3 treats a circuit as a collection of interconnected subdesigns. It processes a netlist to identify each group of devices forming a subdesign (step 17). It then separately generates a schematic diagram for each subdesign (step 18) based on layout template included in a pattern database. The schematic diagram generator then produced a top-level schematic diagram as an arrangement of interconnected subdesign schematic diagrams (step 19). Note that at step 18, each device is assigned to at most only one subdesign, and that the symbol for that device is subject only to the placement constraints associated with that subdesign.

In contrast, as illustrated in FIG. 4, a schematic diagram generator in accordance with the invention can assign any device to more than one soft group at steps 24-27. Since each soft group imposes a different set of placement constraints on its members, when a device is a member of more than one soft group, the soft groups may place conflicting placement constraints on the device. Therefore, before determining a position for each device symbol, the schematic diagram generator (step 28) processes the soft groups it generated at steps 24-27 to resolve any conflicts by eliminating some soft groups and retaining others when necessary, thereby to produce a consistent, non-conflicting, set of constraints on device placement. The schematic diagram generator may use any suitable user-provided set of conflict resolution priorities to determine which soft groups to retain when resolving constraint conflicts at step 28. For example, the user may tell the schematic diagram generator to give the highest priority to retaining pattern soft groups, second highest priority to retaining vertical ordering soft groups, third highest priority to retaining horizontal ordering soft groups, and lowest priority to retaining horizontal positioning soft groups.

Placement

After generating soft groups on placement at steps 24-27 and resolving any constraint conflicts at step 28, the schematic diagram generator executes a placement algorithm (step 30) to determine how to position and orient the symbol for each device within the schematic diagram in a manner consistent with the constraints.

Figure 17:
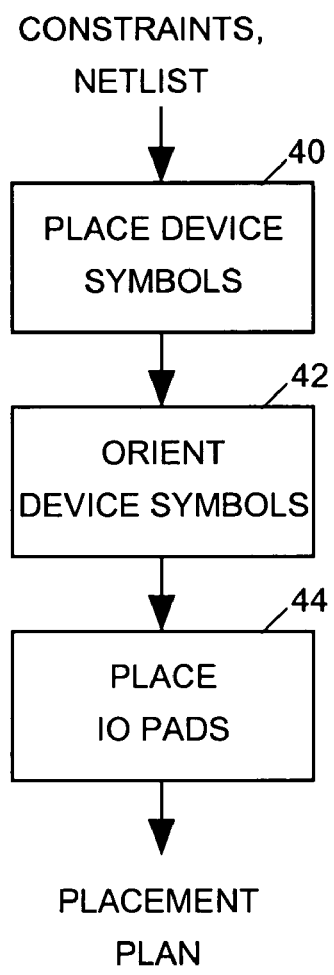
FIG. 17 is a data flow diagram illustrating the placement flow step of FIG. 4 in more detail.
Figure 18:
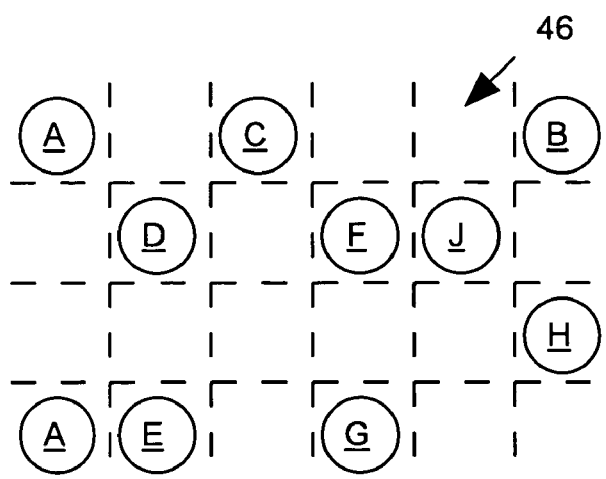
FIGS. 18-20 graphically depict various stages of development of a cell placement plan the method of FIG. 4 could generate for the schematic diagram of FIG. 5
Figure 19:
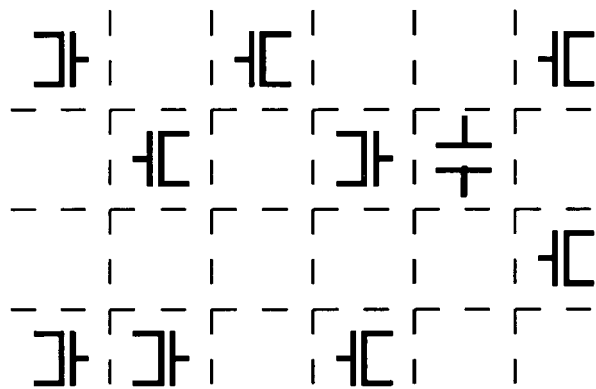
Figure 20:
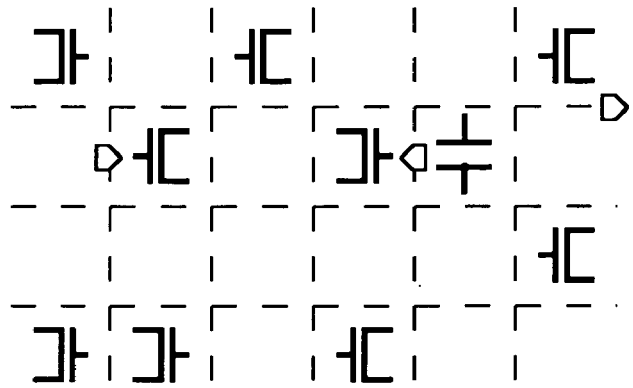

FIG. 17 illustrates the placement algorithm the schematic diagram generator carries out at step 28. The schematic diagram generator initially positions and orients all devices in a manner constant with the constraints (step 40). As illustrated in FIG. 18, the schematic diagram generator organizes the schematic diagram into a rectangular array of rectangles 46, each large enough to hold one symbol, and then assigns each symbol to a separate rectangle in a manner satisfying all constraints. FIG. 18 shows the assignments for symbols representing the devices of FIG. 5. Thereafter, the schematic diagram generator selects a proper orientation for each symbol that is consistent with any orientation constraints soft groups may place on that symbol (step 42). When the soft groups impose no constraints on orientation of a device symbol, the schematic diagram generator orients the symbol so that its current input terminal points upward. The schematic diagram generator flips transistor symbols so that their signal input terminals (e.g., gates or bases) point either to the left or the right as necessary to minimize the length of conductors that will connect their input terminals to other symbol terminals. For example, FIG. 19 depicts how the schematic diagram generator would orient the device symbols for the circuit of FIG. 5. The schematic diagram generator then places symbols representing the circuit's input/output (IO) pads proximate to the terminals of device symbols that will be connected to them (step 44). FIG. 20 shows pad placement for the example circuit of FIG. 5.

Routing

After placing the device symbols at step 30 of FIG. 3, the schematic diagram generator adds routing information to the schematic diagram showing how the IO pin and device symbol terminals are interconnected (step 32). The schematic diagram generator may do this as illustrated in FIG. 5, by using lines to represent the nets interconnecting device terminals. When a line representing a net would be too long or complicated, the schematic diagram generator may alternatively label the device terminals interconnected by the net with the net's name rather than showing the line in the schematic. Routing algorithms capable of performing step 32 are well known to those skilled in the art.

Schematic Diagram Generation

After determining how to place device symbols and IO terminals within the schematic diagram at step 30 and determining how to represent conductors interconnecting the devices and IO terminals at step 32, the schematic diagram generator generates the schematic diagram at step 34, for example, by displaying it on a computer monitor, by printing the schematic diagram on paper.

Thus has been shown and described an example schematic diagram generator that initially establishes one or more placement rules. Each rule corresponds to a separate characteristic pattern of interconnected devices specifies orientation and/or relative positioning within the schematic diagram of a set of symbols representing a group of the devices interconnected to form the characteristic pattern corresponding to that rule. Some or all of the rules may be user-supplied. For each rule, the schematic diagram generator processes the circuit description to identify each group of devices of the electronic circuit exhibiting the rule's corresponding characteristic pattern and generates a soft group consistent with that rule. Each soft group specifies the devices included in the group and specifies one or more constraints on the orientation and/or relative positioning within the schematic diagram of a set of symbols representing the identified group of devices. After establishing the soft groups, the schematic diagram generator processes the constraints to identify any conflicts among those constraints relative to the positioning of device symbols within the schematic diagram, and then resolves any identified conflicts by eliminating some of the soft groups and retaining other in accordance with a conflict resolution scheme, which may be user-defined. Thereafter, the schematic diagram generator carries out a placement process wherein it selects positions within the schematic diagram for symbols representing all devices forming the circuit in a manner consistent with the constraints imposed by the retained soft group. The schematic diagram generator then carries out a routing process wherein it determines how represent conductors interconnecting the devices and generates the schematic diagram including symbols representing electronic devices residing at the selected positions and representations of the conductors interconnecting the electronic devices.

The foregoing specification and the drawings depict exemplary embodiments of the best mode(s) of practicing the invention, and elements or steps of the depicted best mode(s) exemplify the elements or steps of the invention as recited in the appended claims. The appended claims are intended to apply to any mode of practicing the invention comprising the combination of elements or steps as described in any one of the claims, including elements or steps that are functional equivalents of the example elements or steps of the exemplary embodiment(s) of the invention depicted in the specification and drawings.

The invention claimed is:

1. A method for processing a description of a circuit provided by a user to produce a schematic diagram of the circuit, wherein the circuit comprises a plurality of electronic devices interconnected by conductors, wherein the schematic diagram comprises symbols representing the electronic devices and comprises representations of the conductors, and wherein in the schematic diagram resides in a plane having vertical and horizontal directions, the method comprising the steps of:

a. establishing a set of rules, each rule corresponding to a separate characteristic pattern of interconnected devices, wherein each rule specifies at least one constraint on placement within the schematic diagram of a set of symbols representing any set of the devices interconnected to form the characteristic pattern corresponding to that rule, b. for each rule established at step a, processing the circuit description to identify each set of devices of the electronic circuit exhibiting the rule's corresponding characteristic pattern;

c. for each set of devices identified at step b as exhibiting a characteristic pattern corresponding to any rule established at step a, identifying the set of devices as members of a soft group including only that set of devices and establishing at least one constraint on placement within the schematic diagram of symbols representing members of that soft group in accordance with the at least one constraint specified by the rule, wherein more than one soft group is identified, wherein more than one constraint is established, and wherein at least one device of the circuit is identified as being a member of more than one soft group;

d. selecting positions and orientations within the schematic diagram for symbols representing the devices comprising the circuit in a manner consistent with at least one of the constraints established at step c; and e. generating the schematic diagram including symbols representing electronic devices residing at the positions established at step d and representations of the conductors interconnecting the electronic devices.

2. The method in accordance with claim 1 wherein at least one rule established at step a specifies a constraint indicating that symbols representing a set of devices having a characteristic pattern corresponding to that rule are to be placed in a particular order with respect to one direction of the schematic diagram.

3. The method in accordance with claim 1 wherein at least one rule established at step a specifies a constraint indicating that symbols representing a set of devices having a characteristic pattern corresponding to the rule are to be positioned near one another with respect to a particular direction of the schematic diagram.

4. The method in accordance with claim 1 wherein at least one rule established at step a specifies a constraint indicating that symbols representing a set of devices having a characteristic pattern corresponding to the rule are to reside at specific positions relative to one another in the schematic diagram.

5. The method in accordance with claim 1 wherein at least one rule established at step a specifies a constraint indicating that symbols representing a set of devices having a characteristic pattern corresponding to the rule are to reside at specific positions relative to one another and with specific orientations in the schematic diagram.

6. The method in accordance with claim 1 wherein at least one rule established at step a specifies a constraint indicating that at least one symbol representing a device of a set of devices having a characteristic pattern corresponding to the rule is to be placed with a specific orientation within the schematic diagram.

7. The method in accordance with claim 1
wherein a characteristic pattern corresponding to a rule established at step a is that the devices of said any set are interconnected in series such that the devices would form a current path if they were each in a conductive state, and
wherein that rule specifies that symbols representing the devices of said any set are to be ordered in a specific direction of the schematic diagram in accordance with an order in which the devices are interconnected.

8. The method in accordance with claim 1
wherein in accordance with a characteristic pattern corresponding to a rule established at step a comprises devices interconnected such that at least one signal passes between devices of said any set, and
wherein that rule specifies that symbols representing the devices of said any set should be positioned in a particular direction within the schematic diagram in an order determined in accordance with a direction in which the at least one signal passes between devices of the group.

9. The method in accordance with claim 1
wherein a characteristic pattern corresponding to a rule established at step a is that the devices of said any set are all interconnected for receiving current from a same source of current, and
wherein the rule specifies that symbols representing the devices of said any set should be positioned near their current source with respect to a particular direction within the schematic diagram.

10. The method in accordance with claim 1
wherein a characteristic pattern corresponding to a rule established at step a is that the devices of said any set are interconnected to one another in a particular manner, and
wherein that rule specifies that symbols representing the devices of said any set should be positioned in a particular direction within the schematic diagram in an order determined in accordance with a manner in which the devices of said any set are connected to devices of the circuit other than the devices of said any set.

11. The method in accordance with claim 1
wherein the circuit also includes circuit input and output terminals connected to the devices by the conductors,
wherein a characteristic pattern corresponding to a rule established at step a is that the devices of said any set are interconnected to one another in a particular manner and to at least one of the terminals, and
wherein that rule specifies that symbols representing the devices of said any set should be positioned in a particular direction within the schematic diagram in an order determined in accordance with a manner in which the devices of said any set are connected to said at least one of the terminals.

12. The method in accordance with claim 1 wherein step d comprises the substeps of:
d1. identifying any conflicts between the constraints established at step c relative to placement within the schematic diagram of symbols representing devices comprising the circuit;
d2. resolving all conflicts identified at step d1 in accordance with a specified conflict resolution scheme by eliminating some of the constraints and retaining others of the constraints, and
d3. selecting positions within the schematic diagram for symbols representing the devices comprising the circuit, wherein the positions are consistent with all constraints retained at step d2.

13. The method in accordance with claim 12 further comprising the step of obtaining data defining the conflict resolution scheme from the user.

14. The method in accordance with claim 1 wherein step a comprises obtaining input from the user describing at least one rule and its corresponding characteristic pattern of interconnected devices.

15. The method in accordance with claim 1
wherein a characteristic pattern corresponding to a rule established at step a is that the devices of said any set are all interconnected for receiving current from a same source of current, and
wherein that rule specifies that symbols representing the devices of said any set should be ordered in a particular manner with respect to a particular direction within the schematic diagram.

16. Computer-readable media, which when read and executed by a computer, causes the computer to carry out a method for processing a description of a circuit provided by a user to produce a schematic diagram of the circuit,
wherein the circuit comprises a plurality of electronic devices interconnected by conductors,
wherein the schematic diagram comprises symbols representing the electronic devices and comprises representations of the conductors,
wherein in the schematic diagram resides in a plane having vertical and horizontal directions, and
wherein the method comprising the steps of:
a. establishing a set of rules, each rule corresponding to a separate characteristic pattern of interconnected devices, wherein each rule specifies at least one constraint on placement within the schematic diagram of a set of symbols representing any set of the devices interconnected to form the characteristic pattern corresponding to that rule;
b. for each rule established at step a, processing the circuit description to identify each set of devices of the electronic circuit exhibiting the rule's corresponding characteristic pattern;

c. for each set of devices identified at step b as exhibiting a characteristic pattern corresponding to any rule established at step a, identifying the set of devices as members of a soft group including only that set of devices and establishing at least one constraint on placement within the schematic diagram of symbols representing members of that soft group in accordance with the at least one constraint specified by the rule, wherein more than one soft group is identified, wherein more than one constraint is established, and wherein at least one device of the circuit is identified as being a member of more than one soft group;

d. selecting positions and orientations within the schematic diagram for symbols representing the devices comprising the circuit in a manner consistent with at least one of the constraints established at step c; and e. generating the schematic diagram including symbols representing electronic devices residing at the positions established at step d and representations of the conductors interconnecting the electronic devices.

17. The computer-readable media in accordance with claim 16 wherein at least one rule established at step a specifies a constraint indicating that symbols representing a set of devices having a characteristic pattern corresponding to that rule are to be placed in a particular order with respect to one direction of the schematic diagram.

18. The computer-readable media in accordance with claim 16 wherein at least one rule established at step a specifies a constraint indicating that symbols representing a set of devices having a characteristic pattern corresponding to the rule are to be positioned near one another with respect to a particular direction of the schematic diagram.

19. The computer-readable media in accordance with claim 16 wherein at least one rule established at step a specifies a constraint indicating that symbols representing a set of devices having a characteristic pattern corresponding to the rule are to reside at specific positions relative to one another in the schematic diagram.

20. The computer-readable media in accordance with claim 16 wherein at least one rule established at step a specifies a constraint indicating that symbols representing a set of devices having a characteristic pattern corresponding to the rule are to reside at specific positions relative to one another and with specific orientations in the schematic diagram.

21. The computer-readable media in accordance with claim 16 wherein at least one rule established at step a specifies a constraint indicating that at least one symbol representing a device of a set of devices having a characteristic pattern corresponding to the rule is to be placed with a specific orientation within the schematic diagram.

22. The computer-readable media in accordance with claim 16 wherein a characteristic pattern corresponding to a rule established at step a is that the devices of said any set are interconnected in series such that the devices would form a current path if they were each in a conductive state, and wherein that rule specifies that symbols representing the devices of said any set are to be ordered in a specific direction of the schematic diagram in accordance with an order in which the devices are interconnected.

23. The computer-readable media in accordance with claim 16 wherein in accordance with a characteristic pattern corresponding to a rule established at step comprises devices interconnected such that at least one signal passes between devices of said any set, and wherein that rule specifies that symbols representing the devices of said any set should be positioned in a particular direction within the schematic diagram in an order determined in accordance with a direction in which the at least one signal passes between devices of the group.

24. The computer-readable media in accordance with claim 16 wherein a characteristic pattern corresponding to a rule established at step a is that the devices of said any set are all interconnected for receiving current from a same source of current, and wherein the rule specifies that symbols representing the devices of said any set should be positioned near their current source with respect to a particular direction within the schematic diagram.

25. The computer-readable media in accordance with claim 16 wherein a characteristic pattern corresponding to a rule established at step a is that the devices of said any set are interconnected to one another in a particular manner, and wherein that rule specifies that symbols representing the devices of said any set should be positioned in a particular direction within the schematic diagram in an order determined in accordance with a manner in which the devices of said any set are connected to devices of the circuit other than the devices of said any set.

26. The computer-readable media in accordance with claim 16 wherein the circuit also includes circuit input and output terminals connected to the devices by the conductors, wherein a characteristic pattern corresponding to a rule established at step a is that the devices of said any set are interconnected to one another in a particular manner and to at least one of the terminals, and wherein that rule specifies that symbols representing the devices of said any set should be positioned in a particular direction within the schematic diagram in an order determined in accordance with a manner in which the devices of said any set are connected to said at least one of the terminals.

27. The computer-readable media in accordance with claim 16 wherein step d comprises the substeps of:

d1. identifying any conflicts between the constraints established at step c relative to placement within the schematic diagram of symbols representing devices comprising the circuit;

d2. resolving all conflicts identified at step d1 in accordance with a specified conflict resolution scheme by eliminating some of the constraints and retaining others of the constraints, and d3. selecting positions within the schematic diagram for symbols representing the devices comprising the circuit, wherein the positions are consistent with all constraints retained at step d2.

28. The computer-readable media in accordance with claim 27 further comprising the step of obtaining data defining the conflict resolution scheme from the user.

29. The computer-readable media in accordance with claim 16 wherein step a comprises obtaining input from the user describing at least one rule and its corresponding characteristic pattern of interconnected devices.

30. The computer-readable media in accordance with claim 16
   wherein a characteristic pattern corresponding to a rule established at step a is that the devices of said any set are all interconnected for receiving current from a same source of current, and
   wherein that rule specifies that symbols representing the devices of said any set should be ordered in a particular manner with respect to a particular direction within the schematic diagram.

\* \* \* \* \*